United States Patent

Harzer et al.

[11] 4,020,392
[45] Apr. 26, 1977

[54] METHOD OF AND SYSTEM FOR VISUALLY DISPLAYING SEVERAL PERIODICALLY REPRODUCIBLE INPUT SIGNALS

[75] Inventors: Peter Harzer, Eningen u.A.; Hans Funk, Reutlingen, both of Germany

[73] Assignee: Wandel u. Goltermann, Reutlingen, Germany

[22] Filed: June 24, 1976

[21] Appl. No.: 699,258

[30] Foreign Application Priority Data

June 25, 1975 Germany .......................... 2528235

[52] U.S. Cl. ............................... 315/386; 315/392
[51] Int. Cl.[2] ........................................ H01J 29/52
[58] Field of Search .......... 315/383, 384, 385, 386, 315/391, 392, 394

[56] References Cited
UNITED STATES PATENTS 3,599,033  8/1971  Stettiner et al. .................... 315/392

Primary Examiner—Maynard R. Wilbur
Assistant Examiner—T. M. Blum
Attorney, Agent, or Firm—Karl F. Ross; Herbert Dubno

[57] ABSTRACT

Two (or more) periodically reproducible input signals $V_{yI}$, $V_{yII}$, possibly including a constant reference signal, are visually displayed on an oscilloscope screen with the aid of a normally suppressed electron beam under the control of a horizontal-sweep generator and a vertical-sweep generator producing a sinusoidal x-deflection and y-deflection signals $V_{xR}$ and $V_{yR}$, respectively. The x-deflection signal $V_{xR}$ is continuously compared with two (or more) ramp signals $V_{xI}$ and $V_{xII}$, of different periodicities substantially lower than the frequencies of the deflection signals, respectively assigned to the input signals $V_{yI}$, $V_{yII}$ to be displayed; upon the occurrence of a coincidence with one of these ramp signals, the horizontal sweep is halted or slowed down — preferably to the slope of the coincident ramp signal — for a display interval equaling one cycle of the y-deflection signal $V_{yR}$ which at some point during this interval matches the corresponding input signal. At that point the beam is turned on to illuminate the screen for the remainder of the display interval, thereby tracing a short section of the input signal concerned.

10 Claims, 6 Drawing Figures

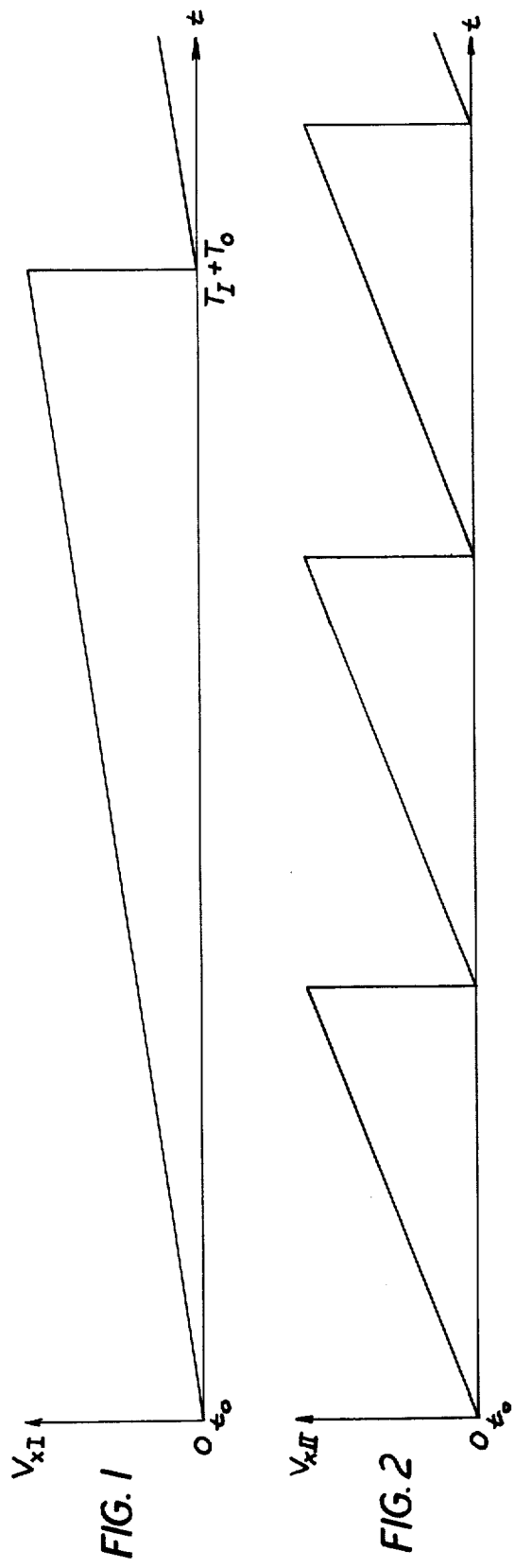
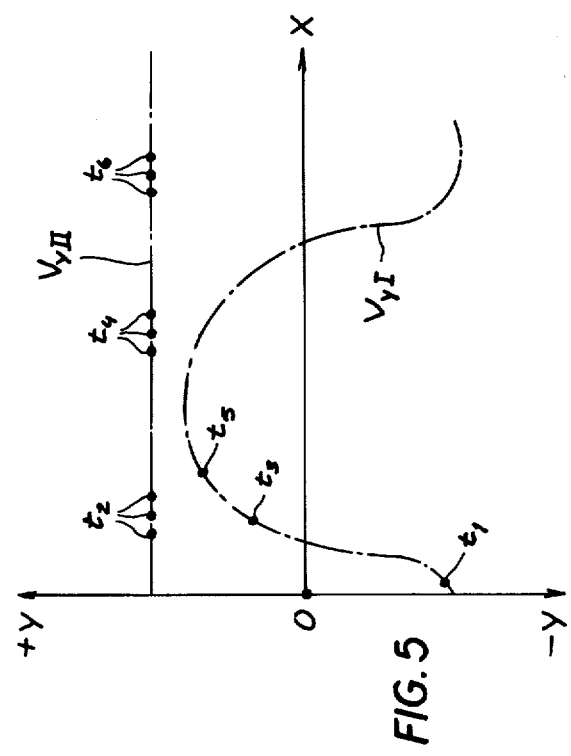
FIG. 1
FIG. 2
FIG. 5

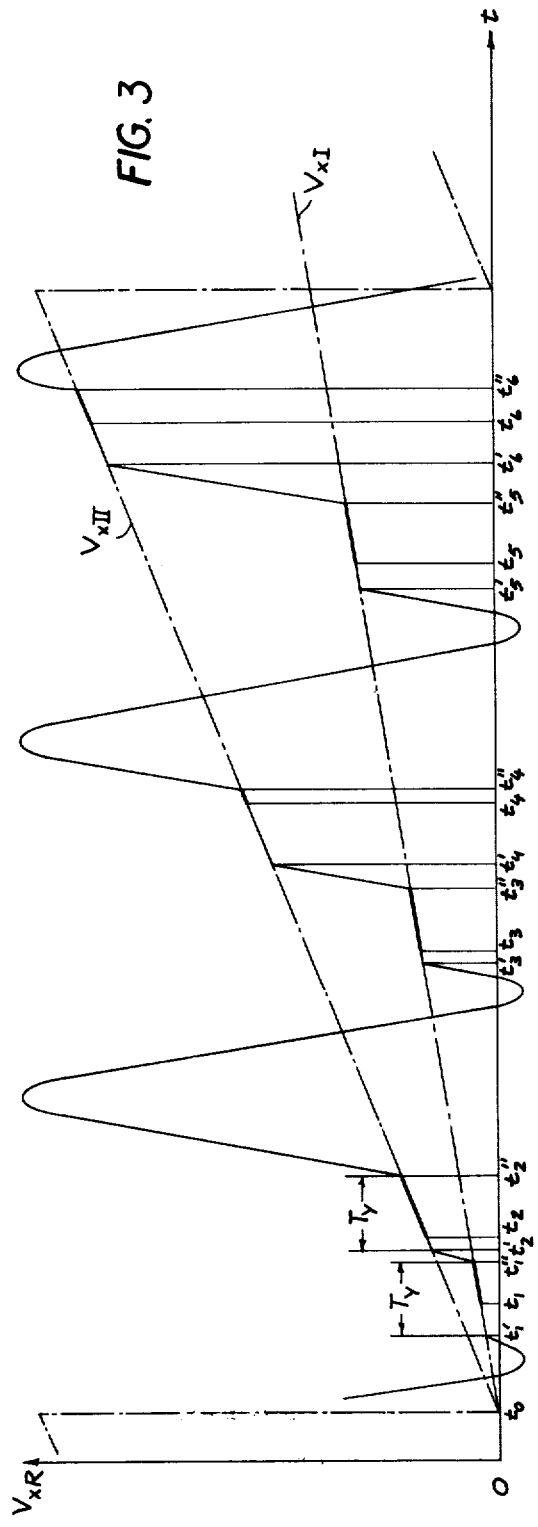

METHOD OF AND SYSTEM FOR VISUALLY DISPLAYING SEVERAL PERIODICALLY REPRODUCIBLE INPUT SIGNALS

FIELD OF THE INVENTION

Our present invention relates to a method of and a system for simultaneously displaying several periodically reproducible input signals on an oscilloscope screen with the aid of a single electron beam. By "periodically reproducible" are meant signals which either recur periodically, and may therefore be sampled at their repetition frequency or at some submultiple thereof, or have a constant value which allows them to be sampled at any frequency. This latter category includes preselected voltages or currents of fixed magnitude designed to form a base or reference line on the oscilloscope screen.

BACKGROUND OF THE INVENTION

In commonly owned U.S. Pat. No. 3,751,708 there has been disclosed and claimed a sweep circuit for an oscilloscope enabling simultaneous visualization of one or more signal voltages from the output of a test circuit along with a constant reference voltage with which the signal voltages are to be compared. According to that system, the beam of a cathode-ray tube forming part of an oscilloscope is electro-magnetically deflected by a triangular or ramp current in the $x$ direction and by a sinusoidal current of substantially higher frequency in the $y$ direction to trace an invisible raster on the screen of the tube, the beam being held suppressed until a comparator detects a coincidence between the amplitude of the $y$-deflection signal and the input signal to be visualized. At that point the $y$ sweep is briefly interrupted and the beam is turned on whereby a short horizontal trace is produced on the screen. As further disclosed in that patent, a comparator receiving a constant reference signal may trigger an acceleration of the horizontal sweep, at the instant when the $y$-deflection signal matches the reference signal, in order to trace a base line during a cycle of the vertical sweep. Since coincidences with other input signals cannot be detected during such a cycle, the tracing of a base line in this manner is allowed to take place only on every $n^{th}$ cycle where $n$ should be equal to at least 20. Because of this intermittency, the base line appears faint in comparison with the traces of the displayed test signals.

The sweep in the horizontal or $x$ direction, in the system of U.S. Pat. No. 3,751,708, has a low repetition frequency or cadence of 1 Hz, for example, consistent with the luminous persistence of the oscilloscope screen. Naturally, the input signal to be displayed on the screen must recur with the same frequency or a multiple thereof. This prevents the simultaneous visualization of two or more periodic input signals which are not harmonically related to a common sweep frequency.

OBJECTS OF THE INVENTION

The general object of our present invention, therefore, is to provide an improved method of and system for simultaneously displaying a plurality of input signals of the type referred to, possibly including at least one reference signal of constant magnitude, with avoidance of the aforestated limitations.

Another object is to provide means in such a system for producing flicker-free traces of two or more input signals on a screen of a one-beam oscilloscope.

SUMMARY OF THE INVENTION

In accordance with our present invention, a plurality of periodically reproducible input signals are displayed on an oscilloscope screen by generating a first and a second periodic raster signal for respectively deflecting the beam of the oscilloscope in an $x$ direction (referred to hereinafter as horizontal) and in a $y$ direction orthogonal thereto (referred to hereinafter as vertical), at frequencies substantially higher than the highest repetition frequency of the input signals (for a constant input signal, of course, the repetition frequency equals zero). The first raster signal is continuously compared with a plurality of ramp signals, one for each input signal, these ramp signals having periodicities corresponding to the periods of reproducibility (as defined above) of the associated input signals. Upon the detection of a coincidence between this raster signal and any one of the ramp signals compared therewith, the rate of change of the horizontal beam deflection is temporarily reduced to a value which may be zero (i.e. the sweep is arrested) and which in any event should not be greater than the slope of the coincident ramp signal. This reduced value of the horizontal sweep is maintained for an interval (referred to hereinafter as a display interval) equaling at least one cycle of the second raster signal so that, within that interval, the latter signal will coincide at least once with the corresponding input signal. This second coincidence, i.e. the identity of the magnitudes of the raster and input signals last referred to, turns on the previously suppressed beam for the remainder of the display interval and, at the same time, substantially halts its vertical deflection.

In this way, the $x$ and $y$ coordinates of each luminous spot on the oscilloscopescreen, forming part of the trace of a specific input signal, are determined by the ramp signal individual to that input signal and by the common raster signals causing the horizontal and vertical deflection of the beam. The ramp signals may be generated, independently of the sweep frequencies, under the control of synchronizing pulses extracted in the usual manner from the respective input signals or in response to timing pulses received directly from the remote end of a transmission path over which these input signals are sent for testing purposes. The repetition frequency of such an input signal can be changed at will without requiring any modification of the sweep frequencies of the oscilloscope.

Advantageously, the raster or deflection signals are sinusoidal so that they can be generated by simple sweep circuits. Since the horizontal sweep is to be interrupted or slowed for at least the length of a cycle of the vertical sweep upon each coincidence with a ramp signal, the frequency of the horizontal-deflection signal ought to be at most equal to that of the vertical-deflection signal. The greatest raster density is achieved by making these two sweep frequencies equal to each other.

According to another important feature of our invention, the temporary lowering of the sweep rate in the $x$ direction upon the detection of a coincidence with a ramp signal is carried out by switchover means connecting the deflecting coil of the horizontal-sweep circuit to an output of the sawtooth generator whose ramp signal is found to coincide with the first raster signal.

The slowing rather than stopping of the horizontal sweep produces a certain elongation of the luminous spot and also insures the correct location of that spot along the abscissa axis.

BRIEF DESCRIPTION OF THE DRAWING

The above and other features of our invention will now be described in detail with reference to the accompanying drawing in which:

FIG. 1 is a graph showing a ramp signal associated with a periodically recurring input signal to be displayed;

FIG. 2 is a similar graph showing a ramp signal associated with a constant input signal designed to establish a reference line;

FIGS. 3 and 4 are graphs showing the horizontal and the vertical deflection of a beam in a system embodying out invention;

FIG. 5 is a graph illustrating the traces formed on an oscilloscope screen by the input signals associated with the ramp signals of FIGS. 1 and 2.

SPECIFIC DESCRIPTION

Figure 6:
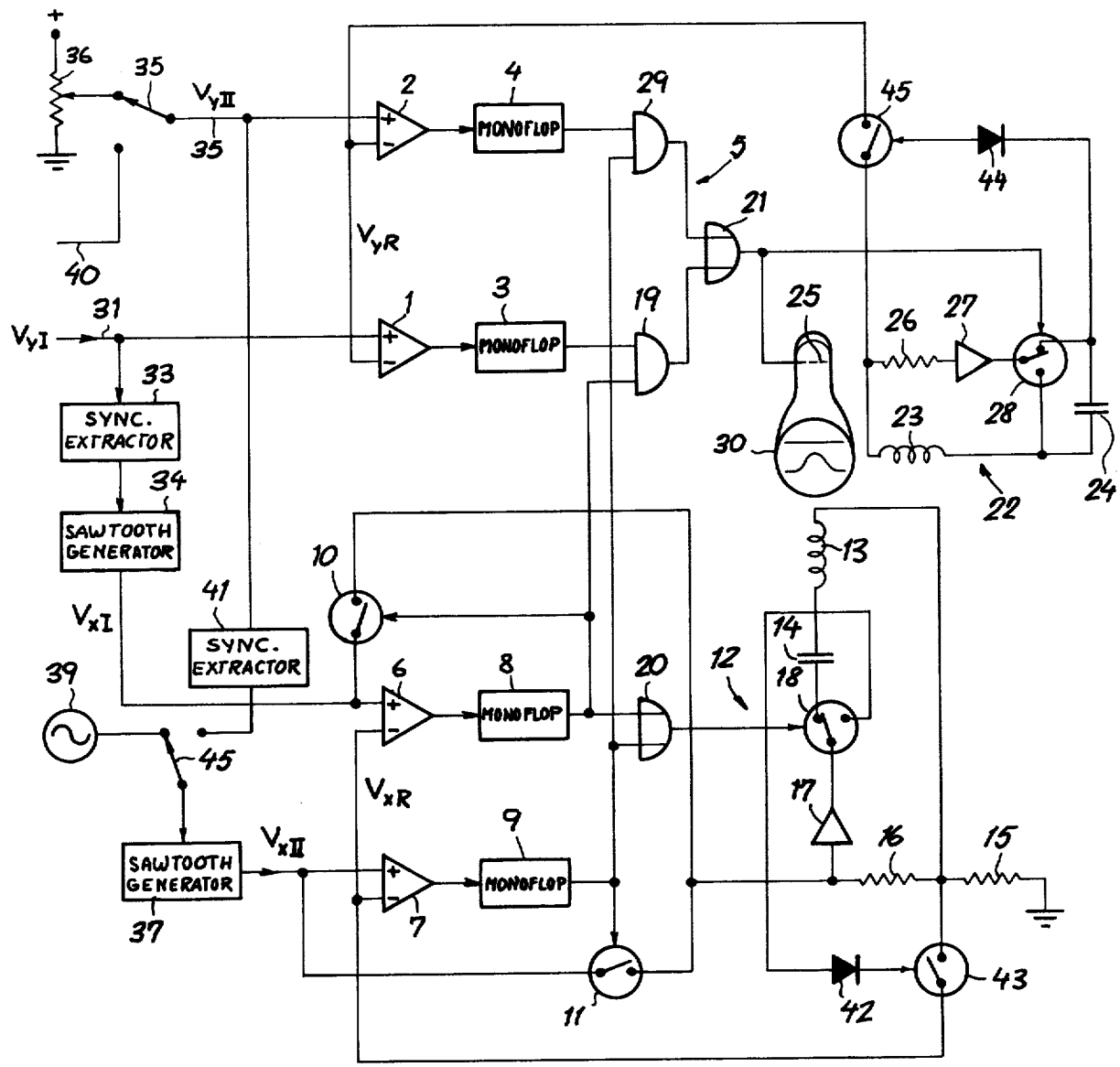
FIG. 6 is a circuit diagram of our improved display system.

In FIG. 1 we have shown a sawtooth voltage representing a ramp signal $V_{xI}$ associated with an input signal $V_{yI}$ (FIG. 5) recurring with a period $T_I$ which is also the period of ramp signal $V_{xI}$. A second ramp signal $V_{xII}$, shown in FIG. 2, has a period $T_{II}$ substantially less than $T_I$ and, for convenience, is shown to start at the same instant $t_0$. Ramp signal $V_{xII}$ is associated with a reference signal $V_{yII}$ represented by a straight horizontal line in FIG. 5.

FIG. 3 illustrates a first raster signal $V_{xR}$ which is a sinusoidal voltage conforming to the current traversing a yoke 13, illustrated schematically as a coil in FIG. 6, whereby the beam of an oscilloscope 30 is horizontally deflected. A second raster signal $V_{yR}$, shown in FIG. 4, is a sinusoidal voltage of somewhat higher frequency corresponding to a current in a yoke 23 serving for the vertical deflection of that beam. In a specific instance, signals $V_{xR}$ and $V_{yR}$ may have frequencies of 5 kHz and 16 kHz, respectively.

As further shown in FIG. 6, yokes 13 and 23 form part of respective sweep circuits 12 and 22 generally similar to one shown in prior U.S. Pat. No. 3,751,708. Thus, horizontal-sweep circuit 12 comprises a capacitor 14 normally connected by an electronic switch 18 in series with yoke 13 and with the output of an amplifier 17 to which a voltage in phase with the yoke current is fed back via a resistor 16; similar elements in sweep circuit 22 include a capacitor 24 in series with yoke 23, an electronic switch 28 and a feedback resistor 26 connected to the input of an amplifier 27. Through an electronic switch 45, which is controlled by the charge of capacitor 24 via a diode 44, the feedback voltage is applied to subtractive inputs (−) of a pair of comparators 1 and 2 whose additive inputs (+) receive the input voltages $V_{yI}$ and $V_{yII}$ depicted in FIG. 5. Voltage $V_{yI}$ appears on a line 31 which may be the output end of an impedance network, transmission path or other test circuit; signal $V_{yII}$ is derived from a potentiometer 36 by way of a manual switch 35 which could be moved onto another input line 40 carrying a different signal.

Comparators 1 and 2 work into respective monoflops 3 and 4 whose off-normal periods equal a cycle of raster signal $V_{xR}$, the frequency of that raster signal being determined by the reactances 23 and 24 in the tank circuit of amplifier 27. Each of these monoflops, when tripped, energizes one input of an associated AND gate 19 and 29 in a logic circuit 5 feeding a common OR gate 21 which controls the switch 28 in sweep circuit 22. Switch 28, when reversed by an output of OR gate 21, open-circuits the capacitor 24 and virtually short-circuits the inductance 23 in series with the small feedback resistor 26 so as to maintain the yoke current substantially constant for the duration of a raster cycle.

A conventional synchronization extractor 33 is connected to line 31 and controls a sawtooth generator 34 which produces the ramp signal $V_{xI}$ of FIGS. 1 and 3. This ramp signal is applied to an additive input (+) of another comparator 6 whose subtractive input (−), together with that of a companion comparator 7, receives the feedback voltage of sweep circuit 12 from a junction of resistor 16 with a grounded resistor 15 by way of an electronic switch 43 which is controlled by the charge of capacitor 14 via a diode 42. Comparators 6 and 7 work into respective monoflops 8 and 9, having the same off-normal period as monoflops 4 and 5, whose outputs are fed on the one hand to the remaining inputs of AND gates 19 and 29, respectively, and on the other hand to an OR gate 20 analogous to OR gate 21. OR gate 20 controls the switch 18 which, when reversed, open-circuits the capacitor 14 connects the inductance 13 directy between the input and the output of amplifier 17 in series with feedback resistor 16. The additive input (+) of comparator 7 receives the ramp signal $V_{xII}$, shown in FIGS. 2 and 3, from a sawtooth generator 37 which is controlled by a free-running local oscillator 39. A manual switch 45 may connect the synchronizing input of sawtooth generator 37 to a sync extractor 41 when the switch 35 is reversed to supply a recurrent input signal from line 40 to line 32 which is tied to extractor 41. The frequencies of sawtooth generators 34 and 37 may range upwardly of about 30 Hz, though this limit is by no means critical.

The brightness of the beam of oscilloscope 30 is controlled by the OR gate 21 whose output lead is connected to a grid 25, in parallel with switch 28, so as to suppress the beam when that gate is not energized.

The outputs of monflops 8 and 9 control respective electronic switches 10 and 11 which, during the display interval timed by these monoflops, establish a path for the feeding of ramp signal $V_{xI}$ or $V_{xII}$ to the input of sweep amplifier 17.

The effect of diodes 42, 44 and switches 43, 45 is to pass the sinusoidal voltages $V_{xR}$, $V_{yR}$ from sweep circuits 12 and 22 to the respective comparators 6, 7 and 1, 2 only when these voltages follow the ascending branches of the sine wave, i.e. when he corresponding yoke currents change from a negative to a positive peak. Each comparator, therefore, detects only one coincidence during any cycle of the respective raster signal. In principle, both ascending and descending branches could be utilized; even in that case, however, there will have to be a minimum length of about one cycle of raster signal $V_{yR}$ for the display interval (timed by monflop 8 or 9) during which the horizontal sweep must be arrested or slowed preparatorily to illumination of the screen. Contrary to the arrangement shown, in which the comparisons of raster signal $V_{xR}$ with ramp signals $V_{xI}$ and $V_{xII}$ are carried out on the same (rising) branch of the curve, the two ramp signals may be sampled on alternate branches. The same applies to raster signal $V_{yR}$ and input signals $V_{yI}$, $V_{yII}$. It is to be understood that the illustrated diode-controlled switches 43, 45 may be replaced by suitable circuitry within the comparators themselves, with the comparator inputs directly tied to circuits 12, 22.

The operation of the system of FIG. 6 will now be described with reference to FIGS. 3 and 4.

As shown in FIG. 3, the amplitude of raster signal $V_{xR}$ matches that of ramp signal $V_{xI}$ at a time $t_1'$ whereby comparator 6 trips the monoflop 8 to start a display interval terminating at a time $t_1''$, this interval measuring exactly one cycle $T_y$ of signal $V_{yR}$. Monoflop 8, at time $t_1'$, energizes one input of AND gate 19 and closes the switch 10 whereby ramp signal $V_{xI}$ is fed to amplifier 17; at the same time, via OR gate 20, the monoflop reverses the switch 18 to cut out the capacitor 14 whereby the current traversing the yoke 13 now follows the signal $V_{xI}$ rather than the signal $V_{xR}$. At one point during the display interval, i.e. at an instant $t_1$, the rising branch of raster signal $V_{yR}$ coincides with the input signal $V_{yI}$ associated with the ramp signal $V_{xI}$. At this point $t_1$, comparator 1 trips the monoflop 3 to energize the second input of AND gate 19 whereby, via OR gate 21, the grid 25 or CRT 30 receives positive voltage to turn on the previously suppressed beam. Simultaneously, switch 28 is reversed to short-circuit the yoke 23 whereby the y deflection of the beam remains constant for the remainder of the display interval, i.e. until time $t_1''$, to produce a short horizontal stroke on the screen, as shown in FIG. 4.

Analogously, comparator 7 responds to a coincidence between signals $V_{xR}$ and $V_{xII}$ at a time $t_2'$ to trip the monoflop 9, thereby energizing one input of AND gate 29 and closing the switch 11 with simultaneous reversal of switch 18 to feed the ramp signal $V_{xII}$ to sweep amplifier 17. The horizontal deflection of the beam, during the next display interval of duration $T_y$ lasting until a time $t_2''$, thus follows the slope of ramp signal $V_{xII}$. In the course of the latter interval, comparator 2 detects a match between signals $V_{yII}$ and $V_{yR}$ to trip the monoflop 4 so that AND gate 29 conducts and, like gate 19 in the previous instance, turns on the beam of CRT 30 and reverses the switch 28. A short horizontal stroke corresponding to input signal $V_{yII}$ then appears on the screen, as shown in FIG. 4, between instants $t_2$ and $t_2''$.

Comparator 6 similarly operates at instants $t_3'$ and $t_5'$ to start display intervals terminating at times $t_3''$ and $t_5''$, respectively. Analogously, display intervals $t_4'-t_4''$ and $t_6'-t_6''$ are established by comparator 7. Instants $t_3$ and $t_5$ mark the start of luminous strokes corresponding to signal $V_{yI}$, initiated by comparator 1, whereas instants $t_4$ and $t_6$ have the same significance for signal $V_{yII}$ and are initiated by comparator 2. The instants $t_1-t_6$ have been marked on the curves $V_{yI}$ and $V_{yII}$ in FIG. 5 and recur during each cycle of the corresponding ramp signal, albeit not in exactly equivalent time positions. Thus, if the frequencies of signals $V_{xI}$, $V_{xII}$ and $V_{yI}$ (or $V_{yII}$) are not all harmonically interrelated, the points of illumination $t_1$, $t_3$, $t_5$ etc. (or $t_2$, $t_4$, $t_6$) will undergo a certain phase shift in successive ramp cycles.

It will be apparent that, if desired, sweep circuit 22 coul be modified in conformity with sweep circuit 12 to let the luminous trace sections on the screen follow the curvature of signal $V_{yI}$ instead of remaining horizontal as shown. In the case of signal $V_{yII}$, which is a horizontal line, such modification would be pointless.

Comparators 1, 2, 6, 7 could be designed as differential amplifiers, with the associated monoflops responding to negative-going zero crossings of their output voltages, for example; this would also eliminate the need for diodes 42, 44 and switches 43, 45. In that case the inputs of switches 10 and 11 could be connected to the outputs of comparators 6 and 7, rather than to their positive inputs as shown, closure of either of these switches then completing a feedback loop from the junction of resistors 15, 16 to the negative comparator inputs to stabilize the sloping output voltage of amplifier 17.

We claim:

1. A method of simultaneously displaying a plurality of periodically reproducible input signals on an oscilloscope screen with the aid of a single electron beam, at least one of said input signals recurring at a predetermined repetition frequency, comprising the steps of:

generating a first and a second periodic raster signal for respectively deflecting said beam in an x direction and in a y direction orthogonal to said x direction, at frequencies substantially higher than the highest repetition frequency of the input signals to be displayed;

generating a plurality of ramp signals, one for each of said input signals, with periodicities corresponding to periods of reproducibility of the associated input signals;

continuously comparing said first raster signal with all said ramp signals;

upon detecting a coincidence between said first raster signal and any one of said ramp signals, temporarily reducing the rate of change of the beam deflection in said x direction to a value not greater than the slope of said one of said ramp signals and maintaining said value for an interval equaling at least one cycle of said second raster signal;

comparing, during said interval, said second raster signal with the input signal associated with said one of said ramp signals and, on detecting a coincidence therebetween, substantially halting the deflection of the beam in said y direction for the remainder of said interval; and maintaining said beam suppressed except during said remainder of said interval.

2. A method as defined in claim 1 wherein said raster signals are sinusoidal and the comparisons with said ramp input signals are carried out only during predetermined half-cycles thereof.

3. A method as defined in claim 1 wherein one of said input signals is a constant.

4. A method as defined in claim 1 wherein the frequency of said first raster signal is at most equal to that of said second raster signal.

5. A system for simultaneously displaying a plurality of periodically reproducible input signals from respective sources on an oscilloscope screen with the aid of a single electron beam, at least one of said input signals recurring at a predetermined repetition frequency, comprising:

first sweep means for generating a first raster signal, of a frequency substantially exceeding the highest repetition frequency of the input signals to be displayed, to deflect said beam in an x direction;

second sweep means for generating a second raster signal, of a frequency substantially exceeding said highest repetition frequency, to deflect said beam in a y direction orthogonal to said x direction;

oscillator means for generating a plurality of ramp signals, one for each of said input signals, with periodicities corresponding to periods of reproducibility of the associated input signals;

first comparison means connected to said first sweep means and to said oscillator means for detecting a coincidence between said first raster signal and any one of said ramp signals;

first switchover means controlled by said first comparison means for modifying the operation of said sweep means in response to said coincidence to reduce the rate of change of the beam deflection in said $x$ direction to a value not greater than the slope of said one of said ramp signals;

timing means in said first switchover means for maintaining said value for an interval equaling at least one cycle of said second raster signal;

second comparison means controlled by said timing means and connected to said second sweep means and to said sources for detecting, during said interval, an identity in the magnitudes of said second raster signal and the input signal associated with said one of said ramp signals;

second switchover means controlled by said second comparison means for substantially halting the deflection of the beam in said $y$ direction, for the remainder of said interval, in response to said identity; and brightness-control means connected to said second comparison for keeping said beam suppressed except during said remainder of said interval.

6. A system as defined in claim 5 wherein said oscillator means comprises a plurality of sawtooth generators respectively producing said ramp signals, said first comparison means comprising a set of first comparators each with an input connected to one of said oscillators, said second comparison means comprising a set of second comparators each with an input connected to one of said sources.

7. A system as defined in claim 6 wherein said timing means comprises a monostable device in cascade with each of said first comparators.

8. A system as defined in claim 7 wherein said second comparison means further includes a pulse generator in cascade with each of said second comparators and logical circuitry including coincidence gates each having input connections to a respective pulse generator and to a respective monostable device.

9. A system as defined in claim 6 wherein said first and second sweep means comprise a pair of free-running sine-wave oscillators each provided with a tank circuit including a deflecting coil for said electron beam.

10. A system as defined in claim 9 wherein said first switchover means comprises circuitry for temporarily connecting the deflecting coil of said first sweep means to an output of the sawtooth generator whose ramp signal coincides with said first raster signal.

* * * * *